United States Patent [19]

Nomura et al.

[11] 4,072,993
[45] Feb. 7, 1978

[54] MULTI-ELEMENT MAGNETIC HEAD

[75] Inventors: Noboru Nomura, Kyoto; Kenji Kanai, Neyagawa; Nobuyuki Kaminaka, Moriguchi; Norimoto Nouchi, Katano, all of Japan

[73] Assignee: Matsushita Electric Industrial Co., Ltd., Osaka, Japan

[21] Appl. No.: 629,981

[22] Filed: Nov. 7, 1975

[30] Foreign Application Priority Data

Nov. 12, 1974 Japan .................................. 49-130787
Nov. 12, 1974 Japan .................................. 49-130788
Nov. 12, 1974 Japan .................................. 49-130789
Dec. 31, 1974 Japan .................................. 50-1690
Dec. 31, 1974 Japan .................................. 50-1691
Dec. 31, 1974 Japan .................................. 50-1692

[51] Int. Cl.² .......................... G11B 5/27; G11B 5/20; G11B 5/22
[52] U.S. Cl. .................................. 360/121; 360/124; 360/125

[58] Field of Search ................ 360/121, 123, 125–126, 360/66, 124

[56] References Cited

U.S. PATENT DOCUMENTS

| 2,915,597 | 12/1959 | Wanlass et al. | 360/121 |
| 3,157,748 | 11/1964 | Eldredge | 360/121 |
| 3,662,361 | 5/1972 | Mee | 360/121 |
| 3,913,139 | 10/1975 | Ito et al. | 360/121 |

*Primary Examiner*—Alfred H. Eddleman
*Attorney, Agent, or Firm*—Stevens, Davis, Miller & Mosher

[57] ABSTRACT

A multi-element magnetic head having a plurality of magnetic heads, in which a common electrode common to the coils of the individual heads is provided. By this construction the number of electrodes is reduced and also the area required for contact between leads from an external circuit and electrodes are reduced. Thus, it is made possible to reduce the head pitch of the magnetic heads.

9 Claims, 13 Drawing Figures

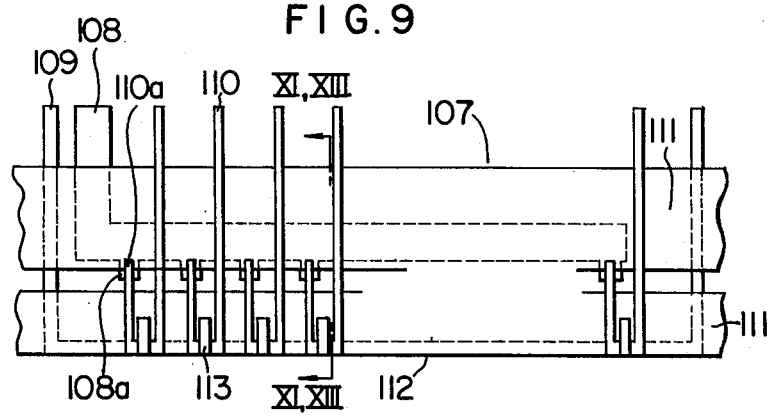
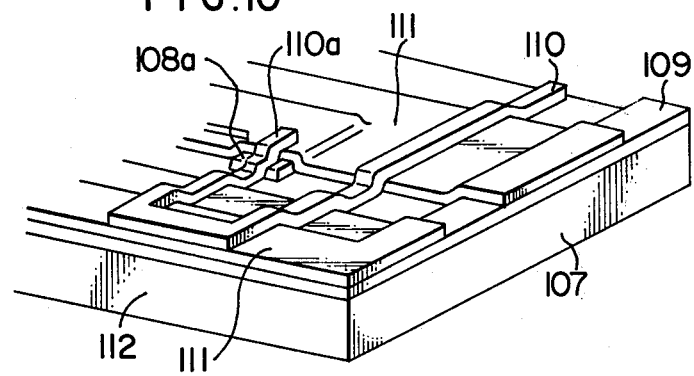
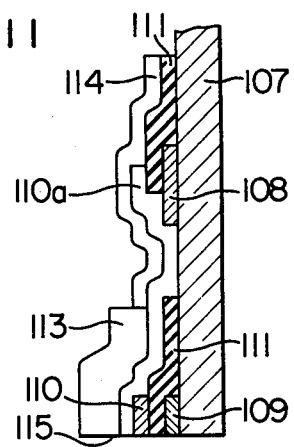

ent magnetic heads.

MULTI-ELEMENT MAGNETIC HEAD

This invention relates to multi-element magnetic heads.

In the drawings:

FIG. 9 is a plan view of the magnetic head manufactured by the procedure shown in FIG. 8;

FIG. 10 is a perspective view of the head of FIG. 9;

FIG. 11 is a sectional view taken along line XI—XI in FIG. 9;

Figure 1:
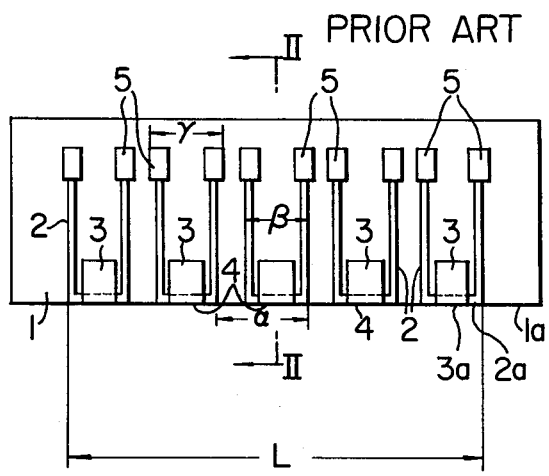
FIG. 1 is a plan view of a prior art multielement magnetic head.

A prior art single turn magnetic head to which the invention pertains will now be described with reference to FIGS. 1 and 2. The construction of this magnetic head is made by arranging on base plate 1 made of a ferromagnetic material such as ferrite and a proper number of coils 2 of a nonmagnetic conductive material such as copper and aluminum etc., and by making the bottom face 2a of the body of the coils 2 flush or on the same plane with the face 1a of the base plate 1 adjacent to the bottoms of the coil bodies and forming head gaps. Yoke portions 3 in the form of a thin film made of a ferromagnetic material such as permalloy are formed to cover the bodies of the coils 2 and base plate 1, and faces 3a which form head gaps are made such that faces 3a are flush with the adjacent bottom faces 2a of the coil bodies, thus forming each of the magnetic heads 4. Electrodes 5 in the form of a thin film made of a non-magnetic conductive material such as aluminum and copper or magnetic conductive material such as permalloy are adhered to the opposite ends of coils 2 of each of the magnetic heads 4.

With the magnetic head of the above prior art example, two electrodes 5 are provided for each magnetic head 4. Even if efforts are made to increase the density of the element arrangement by narrowing the pitch α of the magnetic heads, since the width γ between the two electrodes 5 of the head 4 is greater than the width β of each magnetic head 4, the reduction of the pitch α of the magnetic heads is limited by the fact that the adjacent electrodes 5 of the head 4 are ultimately in contact with each other.

Therefore, in the prior art magnetic head of the above construction, there is a restriction on the reduction of the width L of the entirety of the multi-channel head. The inventors provide, in view of the above fact, a magnetic head which makes it possible to further increase the density of the head track.

An embodiment of the invention will now be described with reference to FIGS. 3 to 5. An L-shaped common electrode 6 of a non-magnetic conductive material such as aluminum and copper is evaporated and adhered on a central portion of the base 1, and by making use of photoetching techniques and electron beam processing techniques etc. projections 6b, five projections in this embodiment, are provided on the main body 6a of the electrode 6 at the bottom of the body.

Then, an insulating film 7, for instance SiO or SiO₂ etc. is formed to cover the common electrode 6 except projections 6b and an upper end portion 6c of the common electrode to prevent short-circuiting of the coil parts and the common electrode. The etching of SiO or SiO₂ can generally be done by using fluoric acid, but since fluoric acid is highly poisonous, it is industrially preferable to avoid etching of the insulating film 7 and to carry out the evaporation using a mask. However, evaporation with a mask has a drawback in that the precision of the pattern of the deposited film is inferior, and in practice, it is difficult to steadily obtain or obtain with stability stripes of a width of about 30 microns. According to the invention the above drawbacks are overcome by forming the common electrode 6 in a comb-like form and forming the insulating film in a purely linear form, by means of photoetching techniques.

Then, like the afore-mentioned prior art example, five coils 2 are provided on the base 1, having one end 2b of each coil joined to each of the projections 6b of the common electrode 6. The other end portion 2c of the coil 2 straddles the insulating film 7 and extends up to an upper portion of the base 1. Each of the electrodes 5 are formed on each of the ends 2c of the coils respectively. Then, yoke portions 3 in the form of a thin plate or thin film made of a ferromagnetic material are formed over the bodies of the coils 2 and base 1 to form magnetic heads 8.

In this way, a magnetic circuit is formed by the base 1 and the tip portion of each yoke portion 3 constituting each magnetic head 8. In recording, current flows from the common electrode 6 to the electrode 5 through each projection 6b of the common electrode 6, one terminal 2b of each coil 2, each coil 2 and the other terminal 2c thereof. With current flowing through the coil 2 a magnetic field is set up around the coil 2, and a magnetic field is set up between the face 3a of the associated yoke portion 3 forming the head gap of the yoke portion 3 and the face 1a of the base 1 forming the head gap of the base plate 1.

In playback, a field set up between the yoke portion 3 and base plate 1 induces a voltage across the coil 2, and the voltage between the common electrode 6 and the associated electrode 5 is detected. The electrodes 5 are not always necessary and are used when the connection between the external leads and terminals 2c of the coils 2 are weak.

The embodiment of the invention will now be described with reference to FIG. 5. In increasing the density by reducing the head pitch α of the magnetic heads 8 the limit of the increase in density is determined not by the width β of the magnetic heads 8, but by the area which is required for the contact of the lead from an external circuit with the electrode 5 adhered or attached to the coil terminal 2c. While there are various methods bonding of the lead 9 to the electrode 5 such as soldering, wire bonding by contact under supersonic heating or bonding by conductive paint, of the present techniques wire bonding is best suited to a precision process. In this case, however, the lead wire 9 is brought into contact by the use of the electrode 5 with pressure and is bonded thereto with supersonic friction, the tip portion 9a bonded with pressure of the lead 9 is deformed by the pressing into a circular form of about 60 microns in diameter. This means that the electrode 5 to which the tip 9a is bonded must have a width of at least 60 microns.

Figure 2:
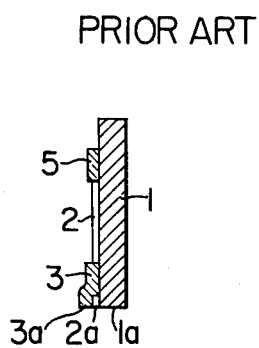
FIG. 2 is a section taken along line II—II in FIG. 1.

Therefore, where two electrodes 5 are required for each magnetic head 4 as in the prior art example of FIG. 1, the head pitch α of each of the heads 4 is required to be at least 120 microns lest the adjacent electrodes 5 of the heads 4 come into contact with one another. Thus, there are limitation in the reduction of the overall width L of the multichannelled heads in the prior art magnetic head construction.

Figure 6:
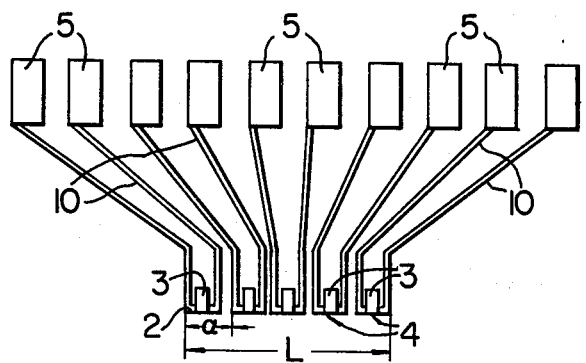
FIG. 6 is a schematic representation of another example of the prior art multi-element magnetic head.

In order to reduce the overall width L of the multichannel head it can be contemplated to broaden the space between each of the electrodes and narrow the head pitch α of the magnetic head 4, and further to connect the coils 2 and electrodes 5 with extended conductors or leads 10 as shown in FIG. 6. This, however, leads to increased resistance due to the extended leads 10 and is thus inadequate.

Figure 5:
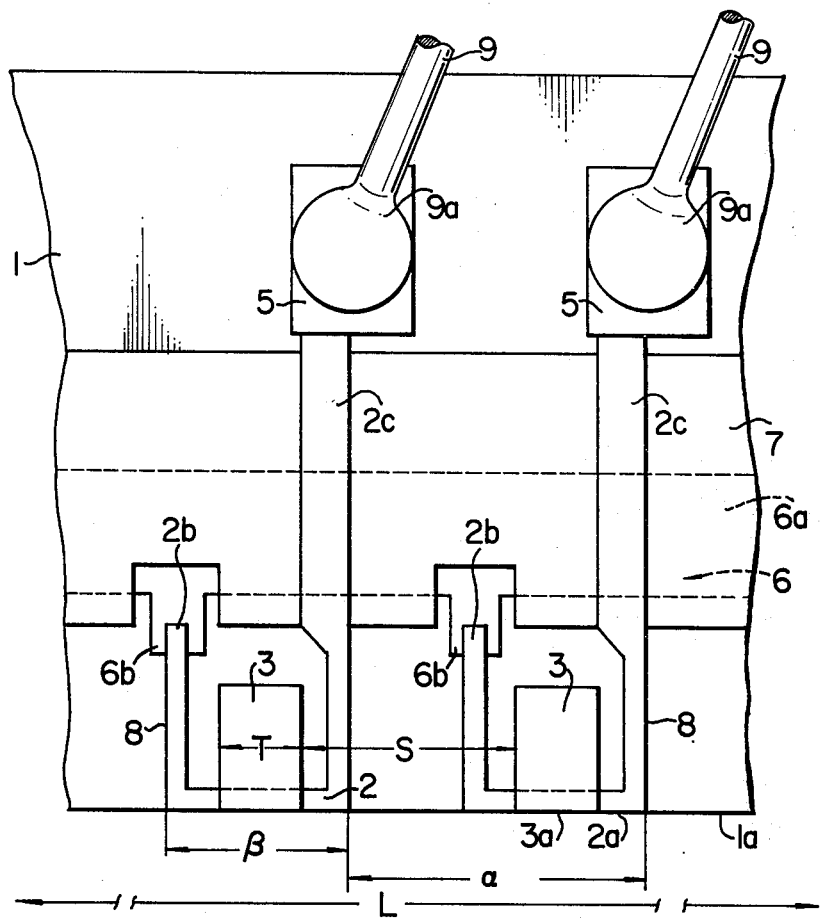
FIG. 5 is an enlarged-scale view showing part of FIG. 3.

With the embodiment of FIG. 5 with the common electrode 6 provided on the base plate 1 and one end of each coil 2 connected to the common electrode 6, it is possible to make the head pitch α of the magnetic heads 8 within 120 microns and hence reduce the overall width L of the multichannelled heads.

The head output in the playback mode is proportional to the width of the head gap in the yoke portion 3, that is, the width T of the head track which contacts with the medium. Therefore, when the length of the head pitch α is reduced to less than one half that of the prior art example, the head output is reduced to less than one half. Also, since the signal-to-noise ratio between the heads reduces in proportion to the square root of the track width T as the track width T is reduced, the signal-to-noise ratio reduces more gradually than the signal reduction in accordance with the reduction of the track width T. Therefore, as the track width T is reduced the head output is decreased and the signal-to-noise ratio decreases, thus the playback becomes difficult to carry out.

In the sense of minimizing attenuation of the signal and deterioration of the signal-to-noise ratio due to increase of density of the multi-channel head, the width of the head track in the yoke portion is made greater than one half the head pitch.

Figure 7:
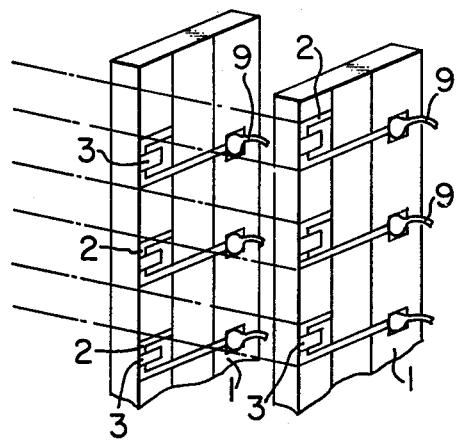
FIG. 7 shows another form of the multielement magnetic head according to the invention applied to a magnetic head of a staggered structure.

On the other hand, in considering reduction of the head pitch, by making the relation between the width of the head gap face of the yoke portion 3, i.e., track width T, and the head pitch α such that T is less than one half of α, it is possible to arrange two multi-channelled magnetic heads in a staggered state by placing the magnetic heads in parallel as shown in FIG. 7.

While magnetic heads in a staggered construction have heretofore been proposed, with the staggered construction applied to the thin film magnetic head, by utilizing photoetching techniques and electron beam processing techniques the mutual head position can be easily determined by displacing the mutual positions of the heads in parallel in the direction of the gap width at the time of manufacture. Thus, it is greatly advantageous in the manufacture of the magnetic head, and by adopting the above-mentioned staggered construction the record density on the recording medium is increased to more than four times compared with the case of the previously mentioned prior art example.

Figure 3:
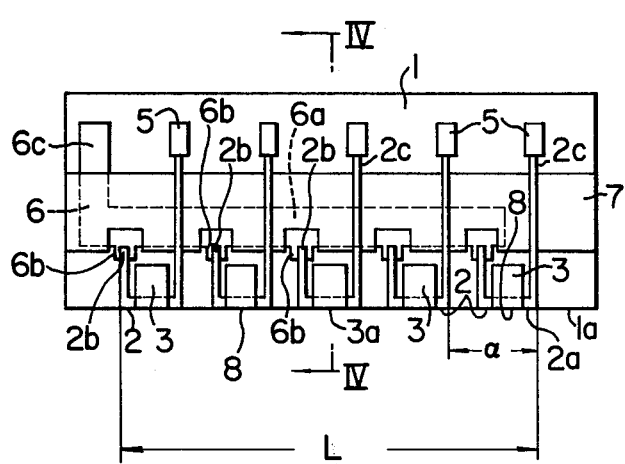
FIG. 3 is a plan view of an embodiment of the magnetic head according to the invention.
Figure 4:
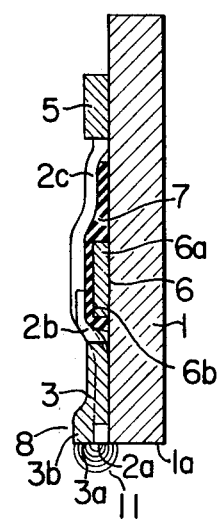
FIG. 4 is a section taken along line IV—IV in FIG. 4.

FIG. 4 shows a section taken along line IV—IV in FIG. 3. In recording, current from the common electrode 6 is divided among each of the individual heads. In each head, the current which arrives passes through the contact area between the projection 6b of the common electrode 6 and the coil 2, and passes into the coil 2, and thereafter the current flows out through the electrode 5. As the current flows through the coil 2, a magnetic field is set up around the coil 2, and as shown in FIG. 4, the field flux flows through the yoke 3 made of a high permeability material such as permalloy provided on the coil 2. Thus, a magnetic head is formed between the yoke 3 and base plate 1 with the coil 2 as the head gap, as shown in FIG. 4. In playback, voltage is induced in the coil 2 by a magnetic flux which flows through the gap between the yoke 3 and base 1, and the reproduced voltage is detected between the common electrode 6 and electrode 5.

Since current flowing through each coil 2 also flows through the common electrode 6, the sum of the currents flowing through the individual coils 2 is equal to the current which flows through the common electrode 6. Since the quantity of current is proportional to sectional area, the current flowing through the coils 2 during recording and playback is restricted by the sectional area of the common electrode 6 if the sum of the sectional areas of the coils 2 constituting the respective gaps is greater than the sectional area of the common electrode 6. Thus, in order to realize the multi-element magnetic head according to the invention it is necessary and indispensable that the sectional area of the common electrode 6 be made greater than the sum of the sectional areas of the individual coils 2.

Figure 8:
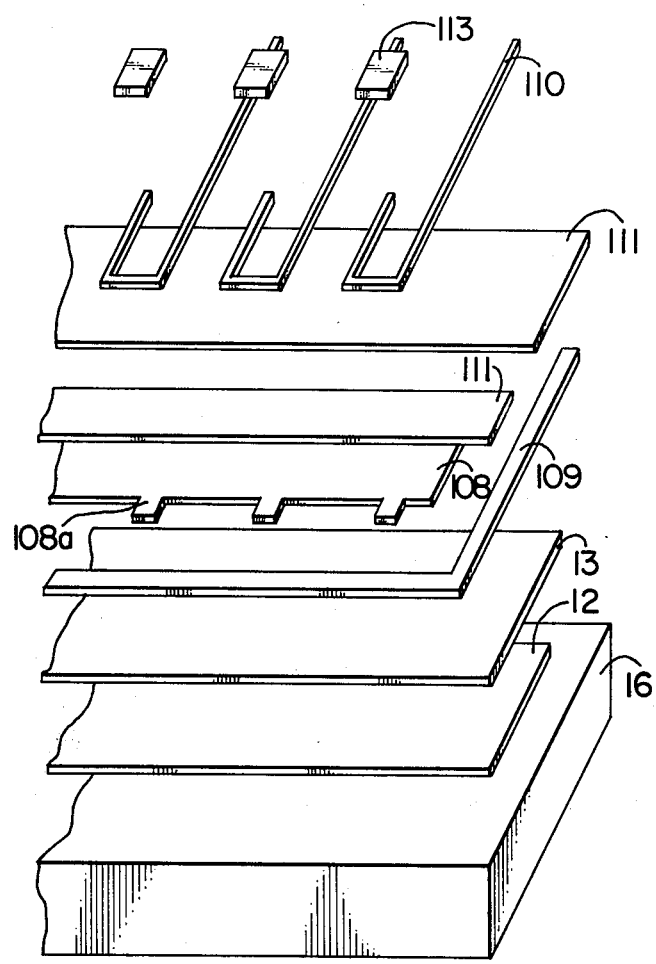
FIG. 8 is a fragmentary exploded perspective view showing the procedure for manufacturing a magnetic head according to the invention.

In the above embodiment a ferromagnetic base plate has been used for one part of the yoke section of the magnetic head, but since ceramic ferromagnetic materials such as ferrite are highly porous and fragile, it becomes difficult to perform the lapping operation used to make the surface roughness 0.05 $\mu$ or less. On the other hand, when employing glass it is relatively easy to make the surface roughness 0.05 $\mu$ or less at the solidifying stage. Also, since the glass is free from pores, there is presented no substantial problem regarding the processing precision during lapping that occurs with ferrite and like materials. Thus, as shown in FIG. 8, it is possible to use a device as a base plate, a device which is made by covering a part of a base 16 of a nonmagnetic material such as glass, with a film 12 of a ferromagnetic material such as permalloy which may be provided by means of deposition, plating or bonding. Designated at 13 is an insulating layer.

Now, a further embodiment shown in FIGS. 8 to 13 will be described. In this embodiment, a coil for generating a bias magnetic field is provided at the head gaps of each of the magnetic head elements, for reducing the bias current to reduce the individual recording amplifier outputs. Also, signal generation and detection coils have their one end connected in common, and the common electrode is made flush with the coil for generating a bias field. Thus, the restriction heretofore imposed upon the density of head arrangement in the width direction thereof is removed or alleviated to permit a denser arrangement of thin layer or thin film magnetic heads.

As shown in FIG. 9, a bias field coil 109 is provided such as to apply a common bias throughout the individual head gaps. Since common electrode 108 and bias field coil 109 are made of the same non-magnetic conductor by means of photoetching techniques, and electron beam processing techniques, etc., they are formed on the same plane. Next, an insulating film 111 of SiO, $SiO_2$, etc. is formed to cover the non-magnetic conductor and other components except for projections 108a and other requisite part of the common electrode 108 and also part of the bias field coil 109 so as to prevent a short-circuit of the bias field coil 109 and common electrode 108 to signal coils 110 to be formed on the bias field coil 109.

At the time of recording, bias current is passed through the bias field coil 109 to produce a bias magnetic field between each yoke 113 and base 107. The signal current is made to flow from the common electrode 108 through each projection 108a thereof to each signal coil 110, thus producing a signal magnetic field between the yoke 113 and base 107 like the bias magnetic field. It will be appreciated that the multi-element magnetic head of this embodiment has a feature in that the means for producing the bias magnetic field and the means for producing the signal magnetic field, which are necessary for the recording of magnetic signals, are different or separately provided, and the bias magnetic field is generated by the bias coil 109 in common with the recording portions of the head.

At the time of playback, a voltage is induced in the signal coil 110 by the magnetic flux which passes between the yoke 113 and base plate 107 and the voltage is detected between the common electrode 108 and each of the signal coils 110.

At the time of recording, the bias current flows through the conductor 109. At the time of playback, an eddy current loss occurs in the conductor 109, and thus the conductor 109 contributes to an increase in the efficiency of the magnetic head core.

Figure 12:
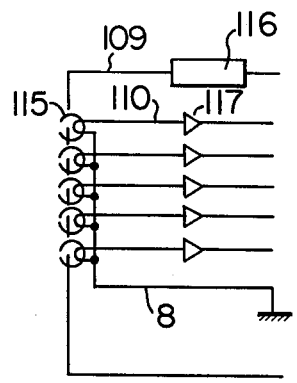
FIG. 12 is an electric connection diagram of the magnetic head according to the invention.
Figure 13:
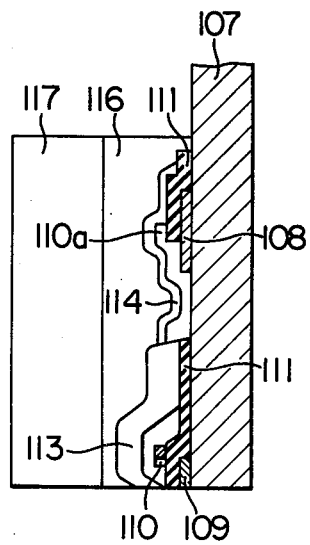
FIG. 13 is a sectional view taken along line XIII—XIII in FIG. 9 showing a different arrangement of bias conductors and coils.

FIG. 12 is a block diagram of the multi-elements magnetic head structure.

At the time of recording, bias current is supplied from a bias current generating means 116 to each of the magnetic heads 115 to cause the bias field coil 109 to produce simultaneously a bias field of the same frequency through the head gap of each magnetic head 115. Signal fields are supplied to each of the heads 115 by a signal current generating and amplifying means 117 respectively, whereby separate signal fields are produced by the signal coils 110 through the head gaps of the respective magnetic heads, and thus the constructed is such that each magnetic head 115 of the multi-element magnetic heads operate independently of each other. As a consequence, unlike the multi-element magnetic head of the prior art example in which bias current generating means are required if bias current and signal current are to flow through each of the magnetic heads respectively, the multi-element magnetic head according to the invention requires only a single bias current generating means for all elements. It is only the signal field which should be supplied to each of the magnetic heads individually, and thus it is possible to reduce the size of the signal current generating means.

The head with a cross section as shown in FIG. 11, however, has a drawback in that both bias field coil 109 and signal coil 110 are present in the head gap. Although such magnetic head presents no problems when the magnetic head does not slide in contact directly with a magnetic medium (such as in the case of a flying head), when the magnetic head slides in contact with a recording medium the metallic material such as aluminum and copper used for the bias field coil 109 and signal coils 110 is prone to plastic flow or deformation due to friction, and this leads to a short-circuit between the bias field coil 109 and the signal coil 110. Thus, it becomes impossible to carry out a sufficient recording of the signal. This drawback may be overcome by the construction shown in FIG. 13. In the embodiment shown in FIG. 13, only the bias coil 109 is present in the gap, and the signal coil 110 is not included in the gap. With this construction the signal coils will never be in direct contact with the recording medium, thus, short circuitting of the signal coil with the bias coil due to friction can be prevented. The bias field coil 109, on the other hand, is subject to wear because the bias field coil is in direct contact with the recording medium. However, since the bias field coil is made of a metallic magnetic material such as permalloy, its accidental wear or short circuiting will not cause crosstalk of the recording signals and with have no effect upon recording and reproduction. Designated at 116 is a resin layer, by means of which a protective layer 117 for protecting the magnetic heads is bonded.

What we claim is:

1. A multi-element magnetic head comprising a ferromagnetic material constituting a base; a yoke section including a plurality of thin plates made of a ferromagnetic material, each of said plates having a portion thereof in contact with said ferromagnetic base and arranged at the end thereof, said ferromagnetic base and each of said yoke sections forming a plurality of head gaps; a plurality of coils having first and second ends each made of a non-magnetic conductive layer and arranged adjacent each of said head gaps; and a common electrode layer commonly connected to the first end of each of said coils, said common electrode layer crossing the other end of each of said coils and being located on said base at a position remote from said gaps.

2. The multi-element magnetic head according to claim 1, wherein the width of each said yoke section (constituting the head track width) is greater than one half the head pitch.

3. The multi-element magnetic head according to claim 1, wherein the width of each said yoke section is less than one half the head pitch.

4. The multi-element magnetic head according to claim 1, wherein said common electrode layer has a comb-like form, an end of each said coil being connected to each tooth of said comb-like common electrode.

5. The multi-element magnetic head according to claim 1, wherein the sectional area of said common electrode layer is greater than the sum of the sectional areas of said coils in said gaps.

6. The multi-element magnetic head according to claim 1, wherein the ferromagnetic material constituting a base is provided on a non-magnetic base plate.

7. The multi-element magnetic head according to claim 1, wherein a non-magnetic conductive layer is provided in each of said head gaps via an insulating layer.

8. The multi-element magnetic head according to claim 7, wherein each of said non-magnetic conductive layers are adapted to carry bias current.

9. The multi-element magnetic head according to claim 8, wherein said non-magnetic conductive layers for application of the bias current are connected in series with one another.

* * * * *